US012591020B2

(12) United States Patent
Ohmae et al.

(10) Patent No.: US 12,591,020 B2
(45) Date of Patent: Mar. 31, 2026

(54) DETERMINATION DEVICE, DETERIORATION DETERMINATION SYSTEM, WORK SUPPORT DEVICE, DETERIORATION DETERMINATION METHOD, AND COMPUTER PROGRAM

(71) Applicant: GS YUASA INTERNATIONAL LTD., Kyoto (JP)

(72) Inventors: Takao Ohmae, Kyoto (JP); Tomohiro Uchiyama, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 418 days.

(21) Appl. No.: 17/794,179

(22) PCT Filed: Jan. 19, 2021

(86) PCT No.: PCT/JP2021/001646
§ 371 (c)(1),
(2) Date: Jul. 20, 2022

(87) PCT Pub. No.: WO2021/149673
PCT Pub. Date: Jul. 29, 2021

(65) Prior Publication Data
US 2023/0048253 A1 Feb. 16, 2023

(30) Foreign Application Priority Data

Jan. 24, 2020 (JP) ................................. 2020-010237

(51) Int. Cl.
*G01R 31/392* (2019.01)
*G01R 31/367* (2019.01)
(Continued)

(52) U.S. Cl.
CPC ......... *G01R 31/392* (2019.01); *G01R 31/367* (2019.01); *G01R 31/396* (2019.01); *H01M 10/4285* (2013.01)

(58) Field of Classification Search
CPC .. G01R 31/367; G01R 31/392; G01R 31/396; H01M 10/4285; H01M 10/06;
(Continued)

(56) References Cited

U.S. PATENT DOCUMENTS 7,119,517 B2    10/2006 Mikuriya et al.
2003/0137277 A1    7/2003 Mori et al.
(Continued)

FOREIGN PATENT DOCUMENTS

JP    2002-56899 A    2/2002
JP    2004126669 A    4/2004
(Continued)

OTHER PUBLICATIONS

Olarte, Validation of thermal imaging as a tool for failure mode detection development (Year: 2019).*
(Continued)

*Primary Examiner* — Aditya S Bhat
(74) *Attorney, Agent, or Firm* — RANKIN, HILL & CLARK LLP

(57) ABSTRACT

A determination device (1) includes: an acquisition unit that acquires determination information for determining a degree of deterioration or guarantee of a lead-acid battery (3); a determination unit that determines the degree of deterioration or guarantee of the lead-acid battery (3) by referring to a database (142) that stores the determination information and the degree of deterioration or guarantee of the lead-acid battery (3) in association with each other based on the acquired determination information; and an output unit that outputs a result determined by the determination unit.

2 Claims, 10 Drawing Sheets

(51) Int. Cl.
    *G01R 31/396*      (2019.01)
    *H01M 10/42*      (2006.01)

(58) Field of Classification Search
    CPC .... H01M 10/484; H01M 10/42; H01M 10/48;
             Y02E 60/10; G06Q 10/063; G06Q 10/20;
             G06Q 10/30; G06Q 30/01; G06Q 50/06;
                                    G06Q 50/40
    See application file for complete search history.

(56)                   References Cited

U.S. PATENT DOCUMENTS

| | | | |
|---|---|---|---|
| 2004/0113588 A1 | 6/2004 | Mikuriya et al. | |
| 2010/0007481 A1 | 1/2010 | Uchida | |
| 2011/0054815 A1* | 3/2011 | Xu | G01R 31/367 |
| | | | 320/132 |
| 2011/0288691 A1* | 11/2011 | Abe | H01M 10/48 |
| | | | 700/297 |
| 2012/0248876 A1 | 10/2012 | Tamura | |
| 2013/0085696 A1 | 4/2013 | Xu et al. | |
| 2014/0139149 A1 | 5/2014 | Hayashida et al. | |
| 2015/0046109 A1* | 2/2015 | Miwa | H01M 10/482 |
| | | | 702/63 |
| 2016/0091573 A1* | 3/2016 | Shiraishi | G01R 31/389 |
| | | | 324/426 |
| 2017/0163068 A1* | 6/2017 | Li | H02J 7/0031 |

| | | | |
|---|---|---|---|
| 2020/0041576 A1* | 2/2020 | Sato | G01R 31/392 |
| 2022/0349941 A1* | 11/2022 | Mizoguchi | G01R 31/367 |
| 2023/0118311 A1* | 4/2023 | Asai | H02J 7/0047 |
| | | | 324/434 |

FOREIGN PATENT DOCUMENTS

| | | |
|---|---|---|
| JP | 2010-022154 A | 1/2010 |
| JP | 2011-044346 A | 3/2011 |
| JP | 2011-89938 A | 5/2011 |
| JP | 2011-232345 A | 11/2011 |
| JP | 2012-068075 A | 4/2012 |
| JP | 2013-516614 A | 5/2013 |
| JP | 2015-015827 A | 1/2015 |
| JP | 2015-154534 A | 8/2015 |
| JP | 2017-121103 A | 7/2017 |
| JP | 2017-152334 A | 8/2017 |
| WO | 2003/069715 A1 | 8/2003 |
| WO | 2013/008814 A1 | 1/2013 |

OTHER PUBLICATIONS

IEEE, IEEE Recommended Practice for Maintenance, Testing, and Replacement of Vented Lead-Acid Batteries of Stationary Applications (Year: 2003).*

International Search Report, Application No. PCT/JP2021/001646 dated Apr. 6, 2021, 2 pages.

* cited by examiner

DETERMINATION DEVICE, DETERIORATION DETERMINATION SYSTEM, WORK SUPPORT DEVICE, DETERIORATION DETERMINATION METHOD, AND COMPUTER PROGRAM

TECHNICAL FIELD

The present invention relates to a determination device, a deterioration determination system, a work support device, a deterioration determination method, and a computer program for determining the degree of deterioration or guarantee of a lead-acid battery.

BACKGROUND ART

Lead-acid batteries are used in various applications in addition to in-vehicle applications and industrial applications. For example, an in-vehicle lead-acid battery is mounted on a moving body such as a vehicle such as an automobile, a motorcycle, a forklift, or a golf cart, and is used as a power supply source to a starter motor at the time of starting an engine and a power supply source to various electrical components such as lights. For example, an industrial lead-acid battery is used as an emergency power supply or a power supply source to a UPS.

It is known that deterioration of lead-acid batteries progresses due to various factors. In order to prevent stop of supply of power due to unexpected loss of function of the lead-acid battery, it is necessary to appropriately determine the deterioration degree of the lead-acid battery and accurately determine the necessity of replacement. Patent Literature 1 discloses an invention of a deterioration determination method in which a secondary battery is self-discharged by being left for an arbitrary time, self-discharged, or forcibly discharged, and deterioration of the secondary battery is determined by a magnitude or a ratio of a voltage or comparison with a non-defective product of the secondary battery.

PRIOR ART DOCUMENT

Patent Document

Patent Document 1: JP-A-2011-232345

SUMMARY OF THE INVENTION

Problems to be Solved by the Invention

As a guarantee period of an in-vehicle lead-acid battery, for example, a period until 3 years elapse from the time of mounting the lead-acid battery on a vehicle or a period until the travel distance reaches 50,000 km, whichever comes first, is set. For this reason, a store of a lead-acid battery determines the deterioration degree of the lead-acid battery brought from a user, and determines whether or not the lead-acid battery is a target of guarantee such as replacement.

Among the guarantees, a case where an abnormality has occurred in a product is a target of replacement, and for example, a case where the product is charged and recovered is not a target of replacement. In addition, in a case where a trouble occurs due to overuse in use, insufficient care by the user, negligence, or an accident, the product is not a target of replacement. In a store that sells a lead-acid battery, it is necessary to determine whether or not the product is a target of replacement based on a manual, which requires man-hours and labor.

The degree of guarantee is determined by the following procedures.

(1) A use state (use period, travel distance, failure situation, vehicle history, guarantee period) is checked.

(2) Appearance information (liquid smear, corrosion of terminal, or breakage of container) is acquired.

(3) Internal inspection information (specific gravity of electrolyte solution or terminal voltage) is acquired.

(4) It is determined to which following matter the degree of guarantee corresponds.

1: The product is returned to a user as a normal product.

2: Although it is normal, it is returned after performing auxiliary charge.

3: The product is exchanged as an abnormal product.

(5) If it is unknown, the product is sent to a manufacturer, analyzation is made by the manufacturer, and final determination is made.

These procedures are manual, but determination in (4) requires certain skills and experience. In the case of strict determination, the dissatisfaction of the user increases, and in the case of loose determination, the guarantee cost increases.

An object of the present invention is to provide a determination device, a deterioration determination system, a work support device, a deterioration determination method, and a computer program capable of quickly, objectively, and accurately determining the degree of deterioration or guarantee of a lead-acid battery.

Means for Solving the Problems

A determination device according to an aspect of the present invention includes: an acquisition unit that acquires determination information for determining a degree of deterioration or guarantee of a lead-acid battery; a determination unit that determines the degree of deterioration or guarantee of the lead-acid battery by referring to a database that stores the determination information and the degree of deterioration or guarantee of the lead-acid battery in association with each other based on the acquired determination information; and an output unit that outputs a result determined by the determination unit.

A deterioration determination system according to an aspect of the present invention includes: the above-described determination device; an imaging unit that captures an image of the lead-acid battery; a voltage measurement unit that measures a terminal voltage of the lead-acid battery; a specific gravity measurement unit that measures a specific gravity of an electrolyte solution of the lead-acid battery; and a terminal that acquires the image, the terminal voltage, or the specific gravity, and outputs the image, the terminal voltage, or the specific gravity to the determination device.

A work support device according to an aspect of the present invention includes: a receiving unit that receives, from an external terminal, determination information for determining a degree of deterioration or guarantee of a lead-acid battery acquired by acquisition work; a first determination unit that determines the deterioration of the lead-acid battery based on the received determination information; a second determination unit that determines whether or not to perform next acquisition work of determination information based on a result determined by the first determination unit; and a transmission unit that transmits an instruction of the acquisition work to the terminal when the second determination unit determines to perform the acquisition work.

A computer program according to an aspect of the present invention causes a computer to execute processing of: acquiring determination information for determining a degree of deterioration or guarantee of a lead-acid battery; determining the degree of deterioration or guarantee of the lead-acid battery by referring to a database that stores the determination information and the degree of deterioration or guarantee of the lead-acid battery in association with each other based on the acquired determination information; and outputting a result that is determined.

MODE FOR CARRYING OUT THE INVENTION

Outline of Embodiment

Figure 1:
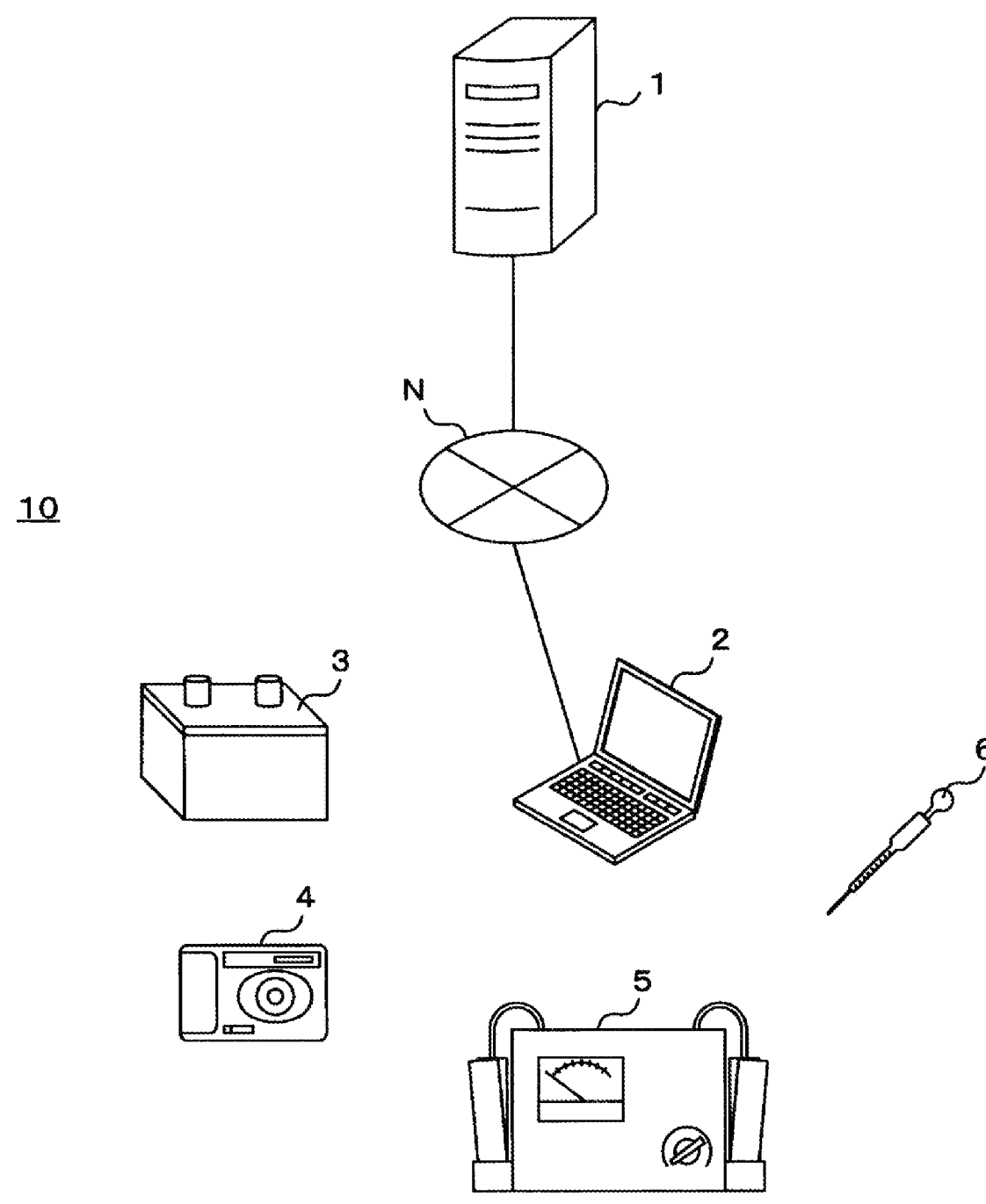
FIG. 1 is a schematic diagram showing an example of a configuration of a deterioration determination system according to a first embodiment.

A determination device according to an embodiment includes: an acquisition unit that acquires determination information for determining a degree of deterioration or guarantee of a lead-acid battery; a determination unit that determines the degree of deterioration or guarantee of the lead-acid battery by referring to a database that stores the determination information and the degree of deterioration or guarantee of the lead-acid battery in association with each other based on the acquired determination information; and an output unit that outputs a result determined by the determination unit.

According to the above configuration, since the degree of deterioration or guarantee of the lead-acid battery is determined by referring to the database that stores the determination information and the degree of deterioration or guarantee of the lead-acid battery in association with each other, it is possible to quickly, objectively, and accurately determine the degree of deterioration or guarantee of the lead-acid battery without depending on the skill of a judge.

Because processes for determining are reduced and quick determination is enabled, user satisfaction is improved, and unnecessary guarantee costs are reduced.

The lead-acid battery also includes a lead-acid battery module in which a plurality of lead-acid batteries are connected in series.

A determination device according to an embodiment includes: an acquisition unit that acquires determination information for determining a degree of deterioration or guarantee of a lead-acid battery; and a determination unit that determines the deterioration degree or the degree of guarantee of the lead-acid battery by inputting the acquired determination information to a learning model that outputs the deterioration degree or the degree of guarantee of the lead-acid battery when the determination information is input.

According to the above configuration, the degree of deterioration or guarantee of the lead-acid battery can be easily and satisfactorily determined.

In the above-described determination device, the determination information may be appearance information including liquid smear, corrosion of a terminal, or breakage of a container, or image information of the lead-acid battery.

Sulfuric acid may leak due to bending of the terminal, and the degree of deterioration or guarantee can be determined by appearance information about the terminal, liquid smear, or breakage, or image information in which the terminal, liquid leakage, or breakage is confirmed. It is also possible to determine whether the breakage or the like of the container is caused by a defect in manufacturing, overuse in use, insufficient care, negligence, or an accident. That is, even if an abnormality is recognized from the appearance information or the image information, it is possible to determine the degree of guarantee of the lead-acid battery, such as not being a target of free replacement, based on the relationship between the appearance information or the image stored in the database and the degree of deterioration or guarantee of the lead-acid battery.

In the above-described determination device, the determination information may further include at least one piece of information selected from the group consisting of use state information including a use period or a travel distance, internal inspection information including a specific gravity of an electrolyte solution or a terminal voltage, vehicle type information, and position information or an air temperature.

According to the above configuration, the degree of deterioration or guarantee of the lead-acid battery can be satisfactorily determined in consideration of the use state information, the internal inspection information, the vehicle type information, or the position information or the temperature.

There are many cases where the lead-acid battery is brought into a store due to "starting failure", but the "starting failure" may be caused by a failure other than the failure of the lead-acid battery, for example, due to a control device of the vehicle performing control based on the air temperature or the like. In this case, the database can determine that the failure is caused due to its vehicle type or air temperature, and the lead-acid battery is a normal product. Accuracy and efficiency of determination of deterioration of the lead-acid battery are improved.

A deterioration determination system according to an embodiment includes: any of the above-described determination devices; an imaging unit that captures an image of the lead-acid battery; a voltage measurement unit that measures a terminal voltage of the lead-acid battery; a specific gravity measurement unit that measures a specific gravity of an electrolyte solution of the lead-acid battery; and a terminal that acquires the image, the terminal voltage, or the specific gravity, and outputs the image, the terminal voltage, or the specific gravity to the determination device.

According to the above configuration, the internal inspection information and the image can be quickly acquired, and the degree of deterioration or guarantee of the lead-acid battery can be determined.

A work support device according to an embodiment includes: a receiving unit that receives, from an external terminal, determination information for determining a degree of deterioration or guarantee of a lead-acid battery acquired by acquisition work; a first determination unit that determines the deterioration of the lead-acid battery based on the received determination information; a second determination unit that determines whether or not to perform next acquisition work of determination information based on a result determined by the first determination unit; and a transmission unit that transmits an instruction of the acquisition work to the terminal when the second determination unit determines to perform the acquisition work.

According to the above configuration, since the work support device determines whether or not to perform the next determination work based on the result of one determination process, it is possible to omit an unnecessary determination process and to efficiently determine the degree of deterioration or guarantee of the lead-acid battery.

A deterioration determination method according to an embodiment includes: acquiring determination information for determining a degree of deterioration or guarantee of a lead-acid battery; determining the degree of deterioration or guarantee of the lead-acid battery by referring to a database that stores the determination information and the degree of deterioration or guarantee of the lead-acid battery in association with each other based on the acquired determination information; and outputting a result that is determined.

According to the above configuration, it is possible to quickly, objectively, and accurately determine the degree of deterioration or guarantee of the lead-acid battery without depending on the skill of a judge.

A computer program according to an embodiment causes a computer to execute processing of: acquiring determination information for determining a degree of deterioration or guarantee of a lead-acid battery; determining the degree of deterioration or guarantee of the lead-acid battery by referring to a database that stores the determination information and the degree of deterioration or guarantee of the lead-acid battery in association with each other based on the acquired determination information; and outputting a result that is determined.

According to the above configuration, it is possible to quickly, objectively, and accurately determine the degree of deterioration or guarantee of the lead-acid battery without depending on the skill of a judge.

First Embodiment

FIG. 1 is a schematic diagram showing an example of a configuration of a deterioration determination system 10 according to a first embodiment. In the deterioration determination system 10, a determination device 1 of a manufacturer of a lead-acid battery (hereinafter, referred to as a battery) 3 and a terminal 2 of a store of the battery 3 are connected via a network N such as the Internet. The store of the battery 3 is equipped with a camera 4 that images the battery 3, a tester 5 that measures a voltage between terminals of the battery 3, and a hydrometer 6 that measures a specific gravity of an electrolyte solution of the battery 3, in proximity to the terminal 2.

The determination device 1 acquires determination information for determining the degrees of deterioration and guarantee of the battery 3 from the terminal 2, determines the deterioration degree of the battery 3, determines the degree of guarantee, and transmits the obtained results to the terminal 2.

Figure 2:
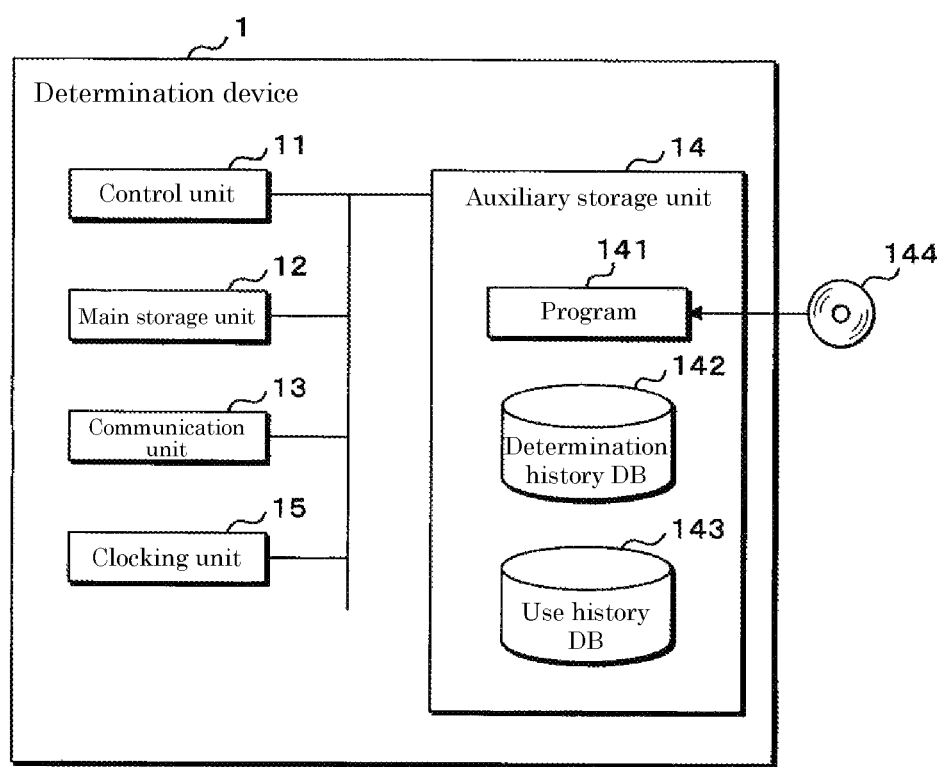
FIG. 2 is a block diagram showing an example of a configuration of a determination device.

FIG. 2 is a block diagram showing an example of a configuration of the determination device 1. The determination device 1 includes a control unit 11 that controls the entire device, a main storage unit 12, a communication unit 13, an auxiliary storage unit 14, and a clocking unit 15. The determination device 1 can include one or a plurality of servers. The determination device 1 may use a virtual machine in addition to a plurality of devices performing distributed processing.

The control unit 11 can include a central processing unit (CPU), a read only memory (ROM), a random access memory (RAM), and the like. The control unit 11 may include a graphics processing unit (GPU). In addition, a quantum computer may be used.

The main storage unit 12 is a temporary storage area such as a static random access memory (SRAM), a dynamic random access memory (DRAM), or a flash memory, and temporarily stores data necessary for the control unit 11 to execute calculation processing.

The communication unit 13 has a function of communicating with the terminal 2 via the network N, and can transmit and receive necessary information. Specifically, the communication unit 13 receives the determination information transmitted by the terminal 2. The communication unit 13 transmits the determination results of the deterioration degree and the degree of guarantee of the battery 3 to the terminal 2.

The auxiliary storage unit 14 is a large-capacity memory, a hard disk, or the like, and stores a program necessary for the control unit 11 to execute processing, a program 141 for performing determination processing of the degrees of deterioration and guarantee described later, a determination history DB 142, and a use history DB 143. The determination history DB 142 may be stored in another DB server.

The program 141 stored in the auxiliary storage unit 14 may be provided by a recording medium 144 in which the program 141 is recorded in a readable manner. The recording medium 144 is, for example, a portable memory such as a USB memory, an SD card, a micro SD card, or a CompactFlash (registered trademark). The program 141 recorded in the recording medium 144 is read from the recording medium 144 using a reading device (not shown) and installed in the auxiliary storage unit 14. Furthermore, the program 141 may be provided by communication via the communication unit 13.

The clocking unit 15 performs clocking.

Figure 3:
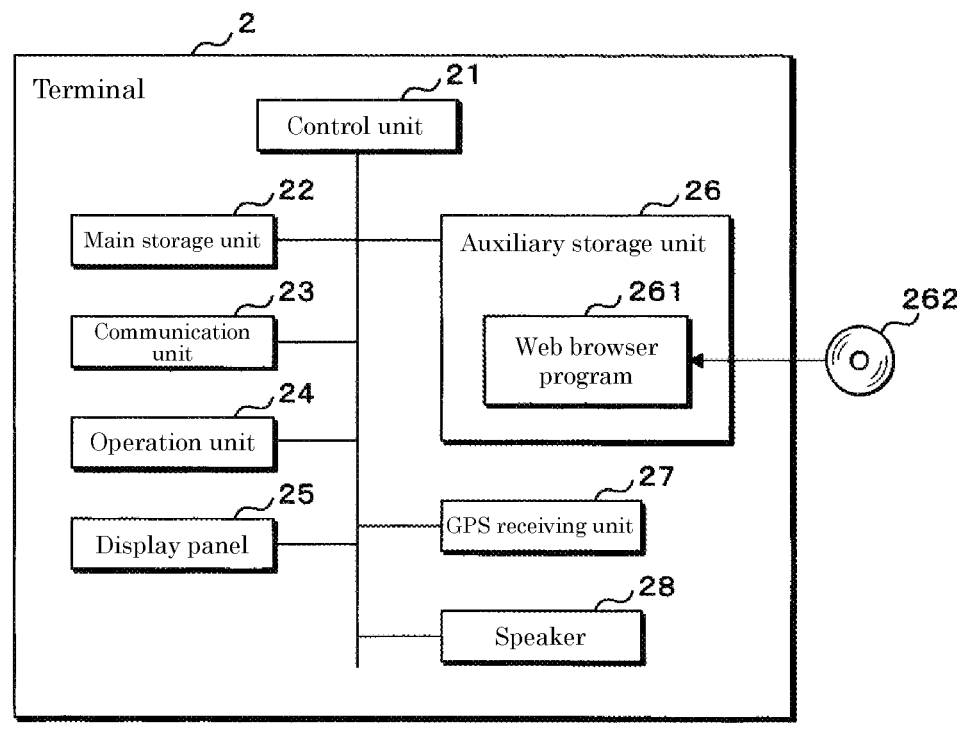
FIG. 3 is a block diagram showing an example of a configuration of a terminal.

FIG. 3 is a block diagram showing an example of a configuration of the terminal 2. The terminal 2 includes a control unit 21 that controls the entire device, a main storage unit 22, a communication unit 23, an operation unit 24, a display panel 25, an auxiliary storage unit 26, a GPS receiving unit 27, and a speaker 28.

The terminal 2 can be configured by, for example, a personal computer, a smartphone, a tablet, or the like.

The control unit 21 can include a CPU, a ROM, a RAM, and the like. The control unit 21 may include a GPU.

The main storage unit 22 is a temporary storage area such as an SRAM, a DRAM, or a flash memory, and temporarily stores data necessary for the control unit 21 to execute calculation processing.

The communication unit 23 has a function of communicating with the determination device 1 via the network N, and can transmit and receive necessary information.

The operation unit 24 includes, for example, a hardware keyboard, a mouse, a touch panel, and the like, and can perform operation of icons and the like displayed on the display panel 25, input of characters and the like, and the like.

The display panel 25 can be configured by a liquid crystal panel, an organic electro luminescence (EL) display panel, or the like. The control unit 21 performs control for displaying necessary information on the display panel 25. The control unit 21 displays, on the display panel 25, information such as the deterioration degree and the degree of guarantee of the battery 3 acquired from the determination device 1.

The auxiliary storage unit 26 is a large-capacity memory or the like, and stores a program necessary for the control unit 21 to execute processing and a web browser program (hereinafter, referred to as a program) 261. The program 261 is provided from the determination device 1 by communication via the communication unit 13. The program 261 may be provided by a recording medium 262 in which the program 261 is recorded in a readable manner.

The GPS receiving unit 27 receives radio waves from a plurality of GPS satellites and detects the position of the terminal 2.

The speaker 28 outputs a voice in accordance with an instruction from the control unit 21.

Table 1 shows an example of a table stored in the determination history DB 142.

TABLE 1

| No. | Use state | | Appearance information | | | Internal inspection information | | |
| | Use period (years) | Travel distance (km) | Liquid smear | Corrosion of terminal | Breakage of container | Image | Specific gravity of electrolyte solution | Terminal Voltage |
|---|---|---|---|---|---|---|---|---|
| 1 | 1.0 | 10000 | 1 | 1 | 1 | | 3 | 1 |
| 2 | 2.6 | 25000 | 1 | 1 | 1 | | 3 | 2 |
| 3 | 3.0 | 40000 | | 5 | | | 1 | 5 |
| 4 | 3.2 | 35000 | | 5 | | | 1 | 5 |
| ... | ... | ... | ... | ... | ... | ... | ... | ... |

| No. | Vehicle type | Position information/ air temperature (° C.) | Charge-discharge test result (%) | Disassembly inspection result | Deterioration degree | Determination |
|---|---|---|---|---|---|---|
| 1 | aaa | 5 | 98 | 1 | 1 | 1 |
| 2 | bbb | 20 | 95 | 2 | 2 | 2 |
| 3 | ccc | 16 | 70 | 3 | 3 | 3 |
| 4 | ddd | 18 | 65 | 4 | 4 | 4 |
| ... | ... | ... | ... | ... | ... | ... |

The determination history DB 142 stores a No. column, a use state column including a use period column and a travel distance column, an appearance information column including a liquid smear column, a corrosion column of a terminal, and a breakage column of a container, an image column, an internal inspection information column including a specific gravity column of an electrolyte solution and a terminal voltage column, a vehicle type column, a position information/air temperature column, a charge-discharge test result column, a disassembly inspection result column, a deterioration degree column, and a determination column. The No. column stores the row No. when the determination of the battery 3 is performed for a large number of different batteries 3 and at different timings of the same battery 3. The use period column stores a use period after mounting or replacement of the battery 3. The travel distance column stores a travel distance of a vehicle on which the battery 3 is mounted. The liquid smear column stores the degree of smear of the electrolyte solution in five stages of from, for example, 1 to 5. 1 is a state where there is no blur, and the degree of blur increases as the number increases. The corrosion column of a terminal stores the degree of corrosion of the terminal in five stages of from 1 to 5. 1 is a state where there is no corrosion, and the corrosion amount increases as the number increases. The breakage column of a container includes a lid, and stores the degree of breakage in five stages of from 1 to 5.

The use state column may further include information of a vehicle history and a compensation period of the battery 3.

The appearance information column may further include information of deformation, discoloration, and liquid amount (liquid level height) of the container.

The image column stores an image obtained by imaging the battery 3. The image preferably includes images viewed from the front, the side, the back, and the plane. More preferably, a bottom view is also included.

The specific gravity column of an electrolyte solution is represented by, for example, five evaluation values of from 1 to 5, where 3 corresponds to the specific gravity at the beginning of manufacturing of the battery 3, the specific gravity decreases as the numerical value increases, and 1 indicates a state in which the specific gravity increases by 4 to 6% as compared with the specific gravity at the beginning of manufacturing. In addition, 5 indicates a state in which the specific gravity decreases by 4 to 6%. The terminal voltage column stores the amount of decrease in the terminal voltage in five stages of from 1 to 5. "1" is a voltage at the start of use, and the amount of decrease in the voltage increases as the number increases.

The vehicle type column stores vehicle types. The position information/air temperature column stores the position information or the temperature of the determination place. Instead of the air temperature, the temperature of the battery 3 may be stored.

The charge-discharge test column stores test results such as a capacity retention ratio when a charge-discharge cycle test is performed. In the case of the capacity retention ratio, the capacity retention ratio is expressed as a ratio of the capacity at the time of determination when the initial capacity is 100%.

The disassembly inspection column is represented by, for example, four evaluation values of from 1 to 4 based on information such as the presence or absence of corrosion of a positive electrode current collector, electrolyte depletion, positive electrode softening, and sulfation acquired by disassembly, the connection state between the element and the terminal, and the like. "1" is a state in which there is no problem at the start of use, and the degree of deterioration such as the presence or absence of corrosion, electrolyte depletion, positive electrode softening, and sulfation increases as the number increases. "3" indicates that the degree of deterioration is the largest, and "4" indicates that the degree of deterioration is "3", but the deterioration is caused by the use situation such as the user's fault.

The deterioration degree column is represented in four stages based on a charge-discharge test result and a result of a disassembly inspection. "1" is a state in which there is no deterioration, and the deterioration progresses as the numerical value increases. "3" indicates that the degree of deterioration is the largest, and "4" indicates that the degree of deterioration is "3", but the deterioration is caused by the use situation such as the user's fault.

The determination column stores a determination result of the degree of guarantee. Examples of the degree of guarantee include the following four stages.

1: The product is returned to a user as a normal product.

2: Although it is normal, it is returned after performing auxiliary charge.

3: The product is exchanged as an abnormal product.

4: Although it is an abnormal product, an abnormality has occurred due to an action of a user, and replacement is performed for a fee.

The degree of guarantee "1" corresponds to the deterioration degree "1", the degree of guarantee "2" corresponds to the deterioration degree "2", the degree of guarantee "3" corresponds to the deterioration degree "3", and the degree of guarantee "4" corresponds to the deterioration degree "4".

The determination history DB 142 is not limited to a case where all the above-described items are stored as the determination information. At least appearance information or an image is included as the determination information. In addition, the determination of the deterioration degree is not limited to the case of using both the charge-discharge test result and the disassembly inspection result. The evaluation method (stages) of each item is not limited to the above case.

The determination history DB 142 may be stored for each model of the battery 3 or for each vehicle type. There are many cases where the battery 3 is brought into a store due to "starting failure", but the "starting failure" may be caused by a failure other than the failure of the battery 3, for example, due to a control device of the vehicle performing control based on the air temperature or the like. In this case, it is determined that the battery 3 is a normal product. It can be seen that there is such a tendency depending on the vehicle type, and the accuracy and efficiency of the determination are improved. It is also possible to provide recent failure statistics for each model.

Table 2 shows an example of a table stored in the use history DB 143.

TABLE 2

IDNo. 1

| No. | Use state | | Appearance information | | | Image | Internal inspection information | | Vehicle type | Position information/ air temperature (° C.) | Deterioration degree | Determination |
| --- | --- | --- | --- | --- | --- | --- | --- | --- | --- | --- | --- | --- |
| | Use period (years) | Travel distance (km) | Liquid smear | Corrosion of terminal | Breakage of container | | Specific gravity of electrolyte solution | Terminal Voltage | | | | |
| 1 | 1.0 | 10000 | 1 | 1 | 1 | | 3 | 1 | aaa | 20 | 1 | 1 |
| 2 | 2.5 | 25000 | 1 | 1 | 1 | | 3 | 2 | aaa | 18 | 2 | 2 |
| . . . | . . . | . . . | . . . | . . . | | | . . . | . . . | . . . | . . . | | . . . |
| 5 | 3.0 | 40000 | | 5 | | | 1 | 5 | aaa | 10 | 3 | 3 |

The use history DB 143 stores, for each battery 3, a No. column, a use state column including a use period column and a travel distance column, an appearance information column including a liquid smear column, a corrosion column of a terminal, and a breakage column of a container, an image column, an internal inspection information column including a specific gravity column of an electrolyte solution and a terminal voltage column, a vehicle type column, a position information/air temperature column, a deterioration degree column, and a determination column. Table 2 shows a use history of the battery 3 of ID No. 1. The use period column, the travel distance column, the liquid smear column, the corrosion column of a terminal, the breakage column of a container, the image column, the specific gravity column of an electrolyte solution, the terminal voltage column, the vehicle type column, the position information/air temperature column, the deterioration degree column, and the determination column store the same contents as the use period column, the travel distance column, the liquid smear column, the corrosion column of a terminal, the breakage column of a container, the image column, the specific gravity column of an electrolyte solution, the terminal voltage column, the vehicle type column, the position information/air temperature column, the deterioration degree column, and the determination column of the determination history DB 142.

The deterioration degree column stores the deterioration degree derived as described later, and the determination column stores the degree of guarantee of the battery 3 based on the derived deterioration degree.

Hereinafter, a method in which the determination device 1 estimates the deterioration degree of the battery 3 and determines the degree of guarantee of the battery 3 in four stages will be described. A case where the control unit 11 acquires determination information of the use state, the appearance information, the image, the internal inspection information, the vehicle type, the position information, or the air temperature to perform determination will be described. The determination information includes at least the appearance information or the image information.

Figure 4:
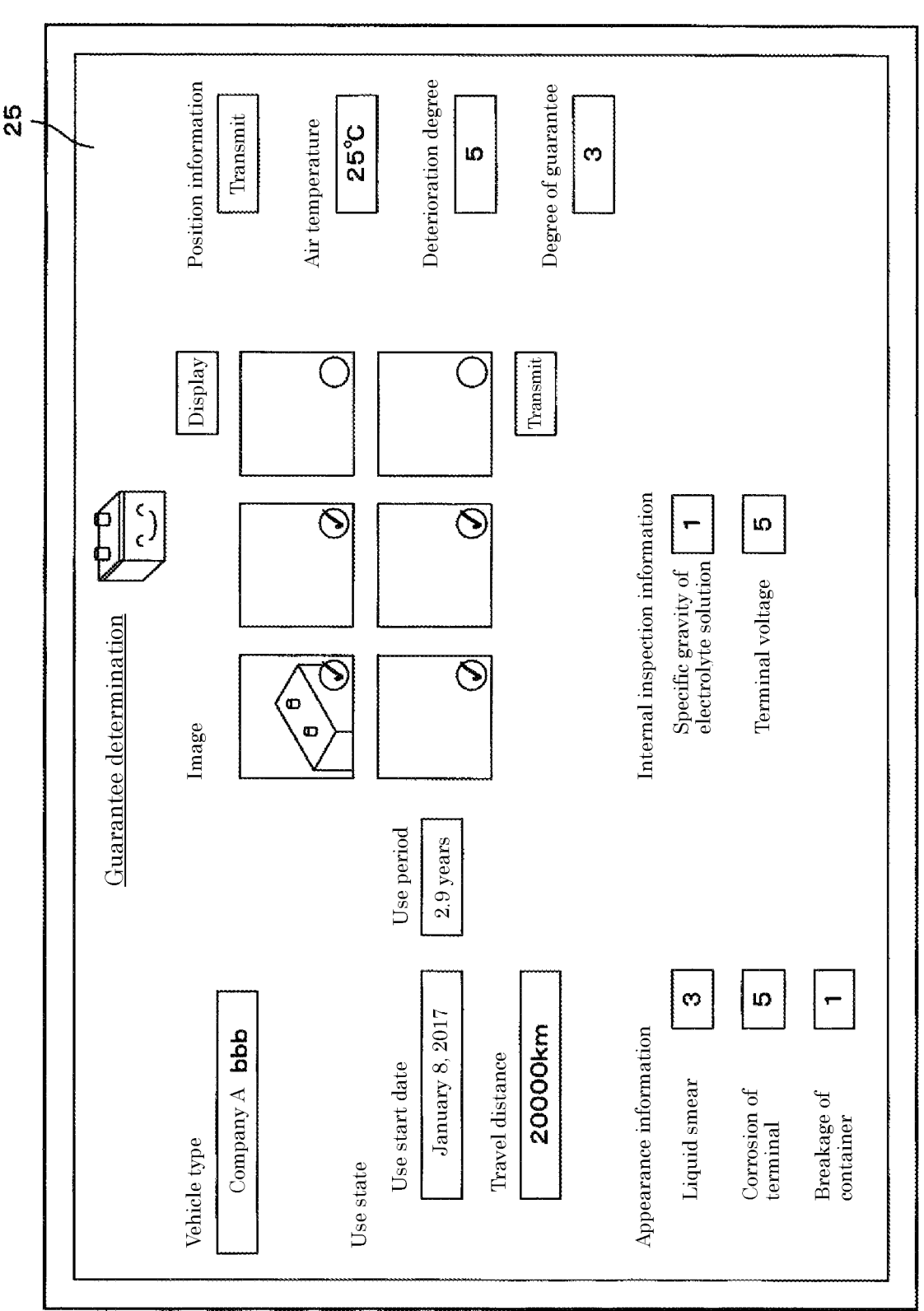
FIG. 4 is an explanatory diagram showing an example of a display screen.

FIG. 4 is an explanatory diagram showing an example of a display screen. The display screen of FIG. 4 shows a result of the determination made by the control unit 11 when a staff member uses the operation unit 24 to make an input on a web browser screen displayed on the display panel 25 based on the program 261. The control unit 21 displays an input field of a vehicle type, input fields of a use state of a use start date and a travel distance, and input fields of liquid smear, corrosion of a terminal, and breakage of a container of appearance information on a left side portion of the display screen. The control unit 21 displays an image display button and a transmission button in an upper center portion of the display screen, and displays input fields of a specific gravity of an electrolyte solution and a terminal voltage in a lower portion. The control unit 21 displays display fields of a transmission button of position information and an air temperature in an upper portion of a right-side portion, and displays determination results of the deterioration degree and the degree of guarantee.

The staff member inputs the manufacturer name and the vehicle type in the input field of the vehicle type. In the input field of the use start date, the date of the start of use is input. When the use start date is input, the control unit 21 displays the calculated use period in the field of the use period adjacent to the input field of the use start date. In the input field of the travel distance, the number of kilometers of the travel distance is input. In the input fields of the liquid smear, the corrosion of a terminal, and the breakage of a container, the staff member inputs the results of the above-described five-stage evaluation. In a case where the staff member clicks the image display button, the control unit 21 displays a plurality of captured images acquired using the camera 4, and when the staff member clicks the selected portion at the lower right of the captured image and clicks the transmission button, the selected captured image is transmitted to the determination device 1. In the input fields of the specific gravity of the electrolyte solution and the terminal voltage, the staff member inputs the results of the above-described five-stage evaluation. When the staff member clicks the transmission button of the position information, the position information is transmitted to the determination device 1. The control unit 21 may display the air temperature based on the position information in the display field of the air temperature, or may receive an input of the air temperature by the staff member and transmit the input to the determination device 1. Instead of the air temperature, an input of the temperature of the battery 3 may be received.

A procedure shown in the flowchart of FIG. 5 will be described below with reference to this explanatory diagram.

Figure 5:
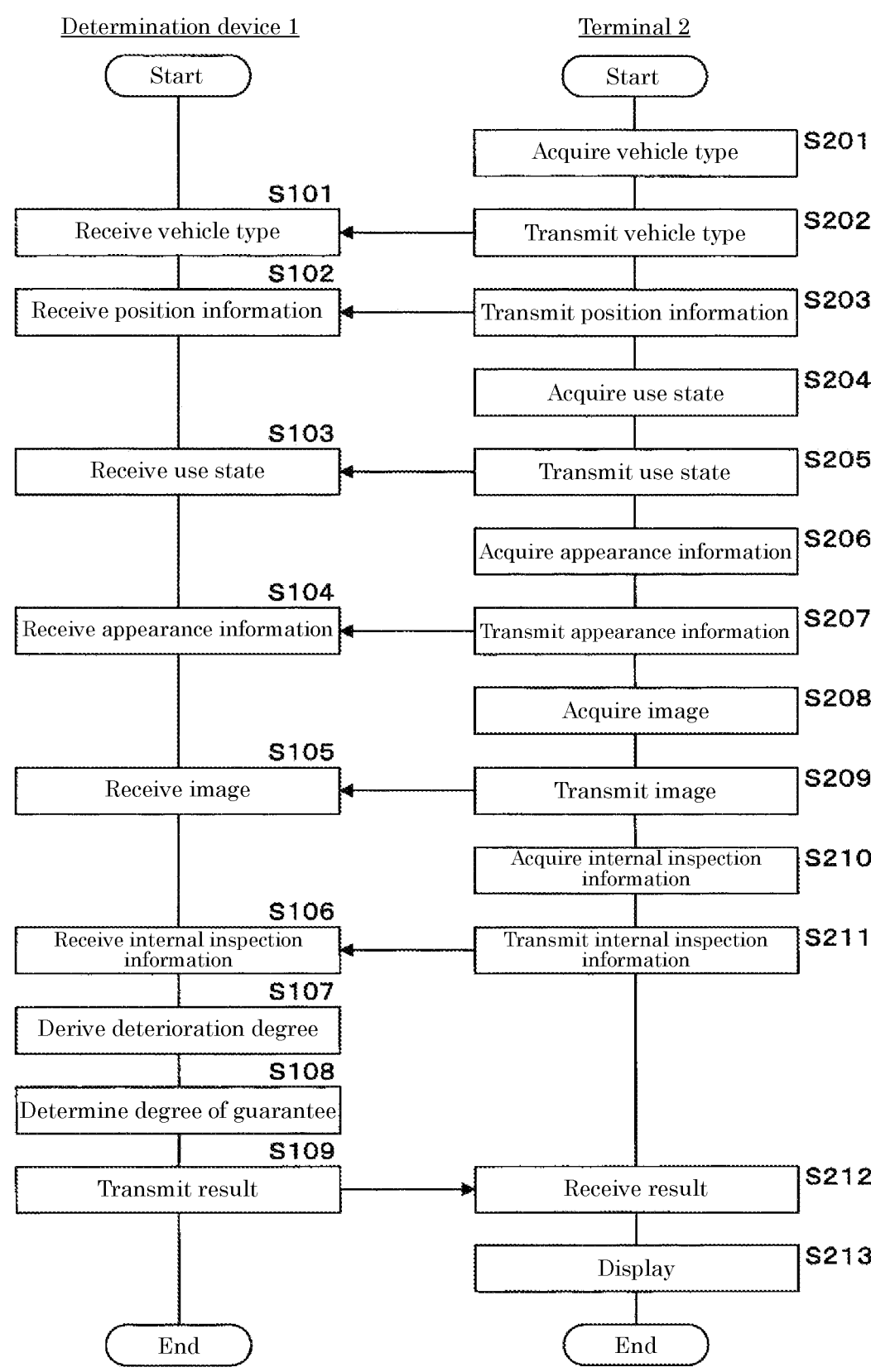
FIG. 5 is a flowchart showing a procedure of processing of deriving the deterioration degree and determining the degree of guarantee by a control unit.

FIG. 5 is a flowchart showing a procedure of processing of deriving the deterioration degree and determining the degree of guarantee by the control unit 11.

The control unit 21 acquires the vehicle type input by the staff member using the operation unit 24 (S201).

The control unit 21 transmits the vehicle type to the determination device 1 (S202).

The control unit 11 receives the vehicle type and stores the received vehicle type in the use history DB 143 (S101).

The control unit 21 transmits the position information detected by the GPS receiving unit 27 to the determination device 1 (S203).

The control unit 11 receives the position information and stores the air temperature corresponding to the position information in the use history DB 143 (S102).

The control unit 21 acquires the use state such as the use period and the travel distance input by the staff member using the operation unit 24 (S204).

The control unit 21 transmits the use state to the determination device 1 (S205).

The control unit 11 receives the use state and stores the use state in the use history DB 143 (S103).

The control unit 21 acquires the appearance information such as the liquid smear, the corrosion of a terminal, and the breakage of a container input by the staff member using the operation unit 24 (S206).

The control unit 21 transmits the appearance information to the determination device 1 (S207).

The control unit 11 receives the appearance information and stores the appearance information in the use history DB 143 (S104).

The control unit 21 acquires an image of the battery 3 captured by the staff member using the camera 4 (S208).

The control unit 21 transmits the image to the determination device 1 (S209).

The control unit 11 receives the image and stores the image in the use history DB 143 (S105).

The control unit 21 acquires internal inspection information such as the specific gravity of the electrolyte solution measured by the staff member using the hydrometer 6 and the terminal voltage measured by the tester 5 (S210).

The control unit 21 transmits the internal inspection information to the determination device 1 (S211).

The control unit 11 receives the internal inspection information and stores the internal inspection information in the use history DB 143 (S106).

The control unit 11 derives the deterioration degree (S107). The control unit 11 derives the deterioration degree corresponding to the acquired determination information based on the rule base of the relationship between the use state, the appearance information, the image, the internal inspection information, the vehicle type, and the position information/air temperature stored in the determination history DB 142, and the deterioration degree based on the charge-discharge test result and the disassembly inspection result. That is, the deterioration degree is determined by a combination of information of each item. In a case where the relationship can be expressed as a function, the control unit 11 may provide a plurality of threshold values for the value of the function in stages and derive the deterioration degree based on the obtained value of the function and the threshold value.

The control unit 11 determines the degree of guarantee based on the deterioration degree (S108).

The control unit 11 sets the determination of the degree of guarantee to "1" when the deterioration degree is "1", sets the determination of the degree of the guarantee to "2" when the deterioration degree is "2", sets the determination of the degree of guarantee to "3" when the deterioration degree is "3", and sets the determination of the degree of guarantee to "4" when the deterioration degree is "4".

The control unit 11 transmits the result (S109) and ends the processing.

The control unit 21 receives the result (S212), displays the result on the display panel 25 (S213), and ends the processing.

According to the present embodiment, since the degree of deterioration or guarantee of the battery 3 is determined by referring to the determination history DB 142 that stores the determination information and the degree of deterioration or guarantee of the battery 3 in association with each other, it is possible to quickly, objectively, and accurately determine the degree of deterioration or guarantee of the battery 3 without depending on the skill of the staff member.

Because processes for determining are reduced and quick determination is enabled, user satisfaction is improved, and unnecessary guarantee costs are reduced.

Second Embodiment

Figure 6:
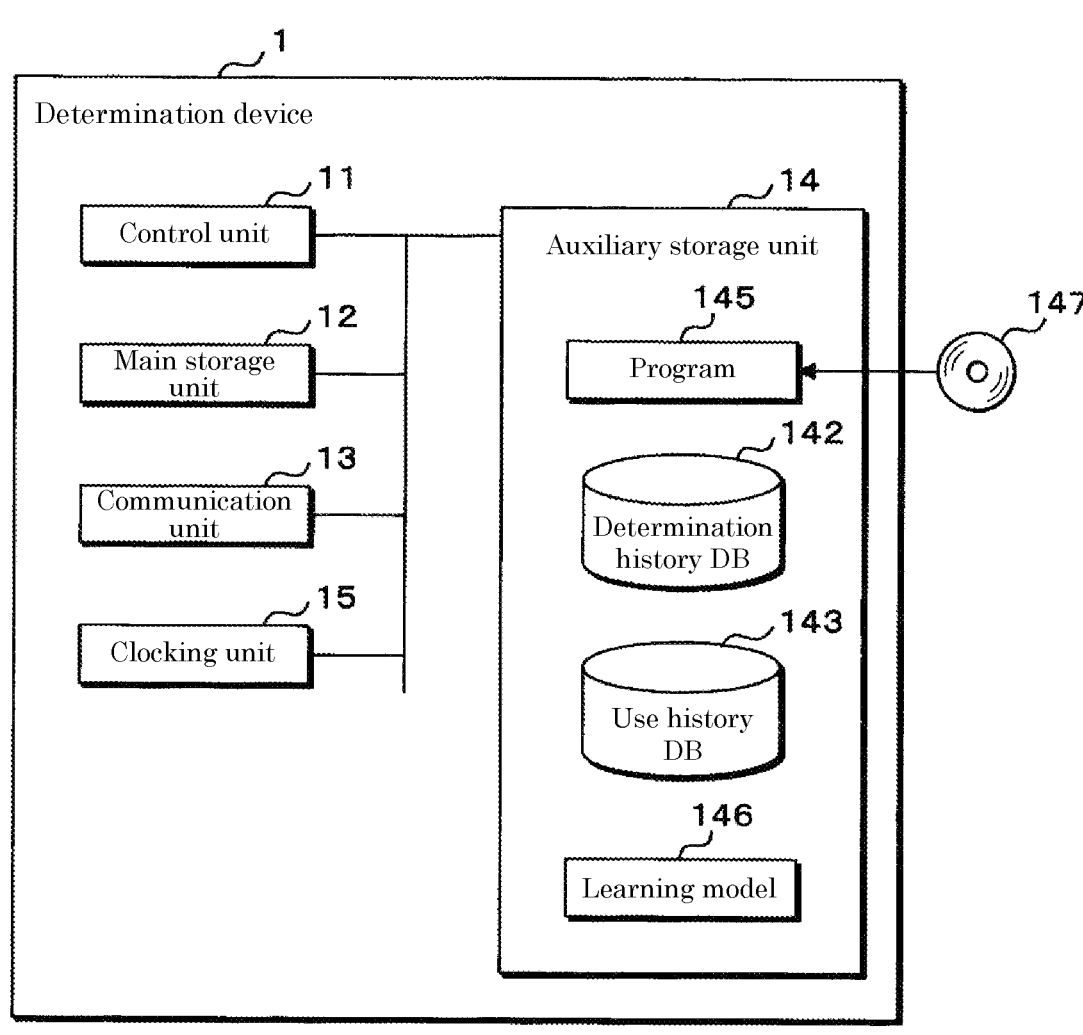
FIG. 6 is a block diagram showing an example of a configuration of a determination device according to a second embodiment.

FIG. 6 is a block diagram showing an example of a configuration of a determination device 1 according to a second embodiment. The determination device 1 according to the second embodiment has the same configuration as the determination device 1 according to the first embodiment except that a program 145 and a learning model 146 are stored in the auxiliary storage unit 14, the program 145 is installed in the auxiliary storage unit 14 by a recording medium 147, and the content of the table of the use history DB 143 is different.

Table 3 shows an example of a table stored in the use history DB 143.

TABLE 3

| | | | | | | | | |
|---|---|---|---|---|---|---|---|---|
| | | | | | | | | IDNo. 1 |
| | | Use | | | Appearance | | | Internal inspection information |
| | | state | | | information | | | Specific |
| No. | Use period (years) | Travel distance (km) | Liquid smear | Corrosion of terminal | Breakage of container | Image | gravity of electrolyte solution | Terminal Voltage |
| 1 | 1.0 | 10000 | 1 | 1 | 1 | | 3 | 1 |
| 2 | 2.5 | 25000 | 1 | 1 | 1 | | 3 | 2 |
| . . . | . . . | . . . | . . . | . . . | | | . . . | . . . |
| 5 | 3.0 | 40000 | | 5 | | | 1 | 5 |

TABLE 3-continued

| | | IDNo. 1 | | | |
|---|---|---|---|---|---|
| No. | Vehicle type | Position information/ air temperature (° C.) | Deterioration degree | Determination | Actual measurement determination |
| 1 | aaa | 20 | 1 | 1 | |
| 2 | aaa | 18 | 2 | 2 | 2 |
| . . . | | . . . | | . . . | |
| 5 | aaa | 10 | 3 | 3 | |

The table of the use history DB 143 of the second embodiment has the same configuration as the table of the first embodiment except that the actual measurement determination column is stored in addition to the content of the table of the use history DB 143 of the first embodiment. The actual measurement determination column stores the determination result of the degree of guarantee of actual measurement based on the charge-discharge test result and the disassembly inspection result. The actual measurement determination is performed for relearning to be described later, and does not need to be always performed at the time of determination.

Figure 7:
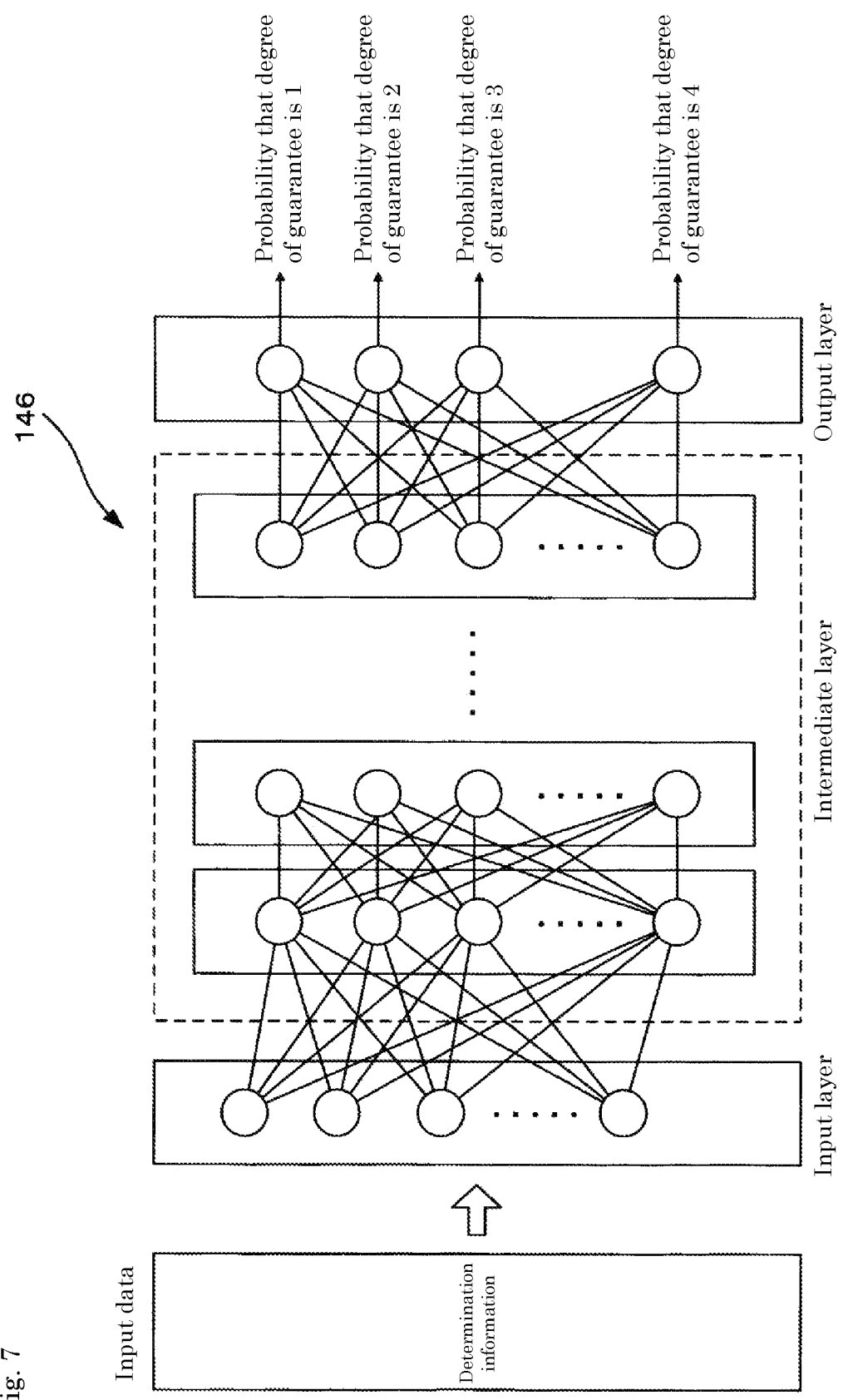
FIG. 7 is a schematic diagram showing an example of a learning model.

FIG. 7 is a schematic diagram showing an example of the learning model 146.

The learning model 146 is a learning model assumed to be used as a program module that is a part of artificial intelligence software, and a multilayer neural network (deep learning) can be used. For example, a convolutional neural network (CNN) can be used, but a recurrent neural network (RNN) may be used. When an RNN is used, the determination information is input over time, and the degree of guarantee is output over time. Other machine learning may be used. The control unit 11 operates to perform calculation on the determination information input to an input layer of the learning model 146 according to a command from the learning model 146, and output the degree of guarantee and the probability thereof as the determination result. For a CNN, an intermediate layer includes a convolution layer, a pooling layer, and a fully connected layer. The number of nodes (neurons) is not limited to the case of FIG. 7.

One or a plurality of nodes exist in the input layer, an output layer, and the intermediate layer, and the nodes of each layer are combined with the nodes existing in the preceding and subsequent layers in one direction with a desired weight. A vector having the same number of components as the number of nodes of the input layer is provided as input data of the learning model 146 (input data for learning and input data for determination).

The learned input data includes at least appearance information or image information. As described above, the appearance information is five-stage evaluation by the staff member of at least one of liquid smear, corrosion of a terminal, and breakage of a container. The image preferably includes images viewed from the front, the side, the back, and the plane, and more preferably includes a bottom view. It is preferable to input a captured image including at least a terminal such that the presence or absence of liquid leakage is known and the degree of breakage of a container is known. For example, sulfuric acid may leak due to bending of the terminal, and appearance information or image information about the terminal, liquid leakage, and breakage can be input to the learning model 146 to acquire the degree of guarantee based on the deterioration degree.

When appearance information or image information including an abnormality such as breakage of a container caused by a problem in use is input, the degree of guarantee "4" for replacement for a fee is output.

The determination information may further include at least one of use state information, internal inspection information, vehicle type information, and position information or air temperature.

The input layer of the learned learning model 146 inputs the determination information. When the data given to each node of the input layer is input and given to the first intermediate layer, the output of the intermediate layer is calculated using the weight and the activation function, the calculated value is given to the next intermediate layer, and the calculated value is successively transmitted to the subsequent layer (lower layer) similarly until the output of the output layer is obtained. Note that all of the weights combining the nodes are calculated by a learning algorithm.

The output layer of the learning model 146 generates the degree of guarantee and the probability thereof as output data.

The output layer outputs, for example, the probability that the degree of guarantee is 1 . . . 0.03, the probability that the degree of guarantee is 2 . . . 0.90, the probability that the degree of guarantee is 3 . . . 0.06, and the probability that the degree of guarantee is 4 . . . 0.01.

Figure 8:
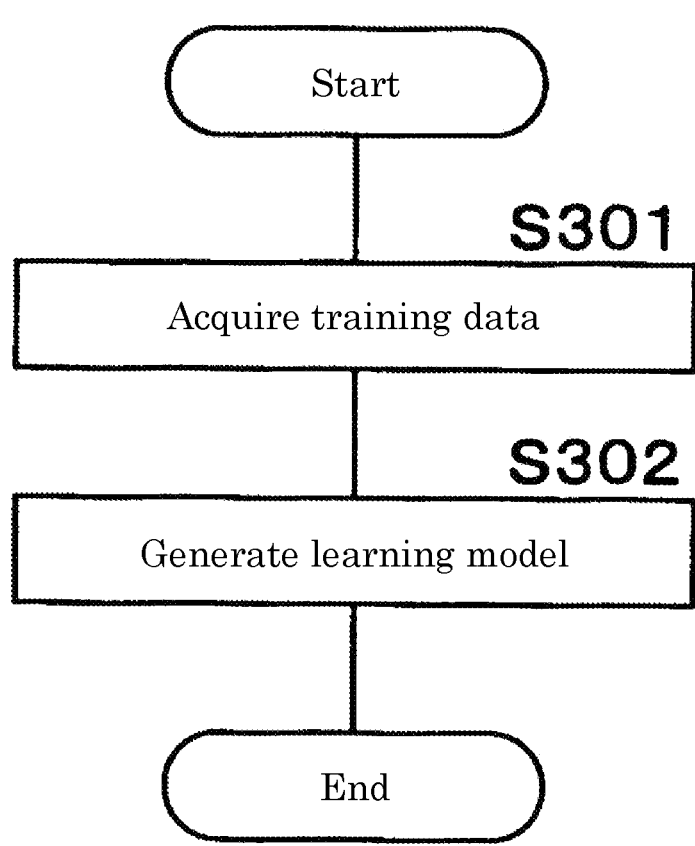
FIG. 8 is a flowchart showing a procedure of processing of generating the learning model by the control unit.

FIG. 8 is a flowchart showing a procedure of processing of generating the learning model 146 by the control unit 11.

The control unit 11 reads the determination history DB 142 and acquires training data in which the determination information of each row is associated with the degree of guarantee (S301).

The control unit 11 uses the training data to generate the learning model 146 (learned model) that outputs the probability of the degree of guarantee when the determination information is input (S302). Specifically, the control unit 11 inputs the training data to the input layer, performs calculation processing in the intermediate layer, and acquires the probability of the degree of guarantee from the output layer.

The control unit 11 compares the determination result of the degree of guarantee output from the output layer with information labeled with the determination information in the training data, that is, the correct value, and optimizes the parameter used for the calculation processing in the intermediate layer so that the output value from the output layer approaches the correct value. The parameter is, for example, the above-described weight (coupling coefficient), the coefficient of the activation function, or the like. The parameter optimization method is not particularly limited, but for example, the control unit 11 optimizes various parameters using an error back propagation method.

The control unit 11 stores the generated learning model 146 in the auxiliary storage unit 14, and ends the series of processing.

Figure 9:
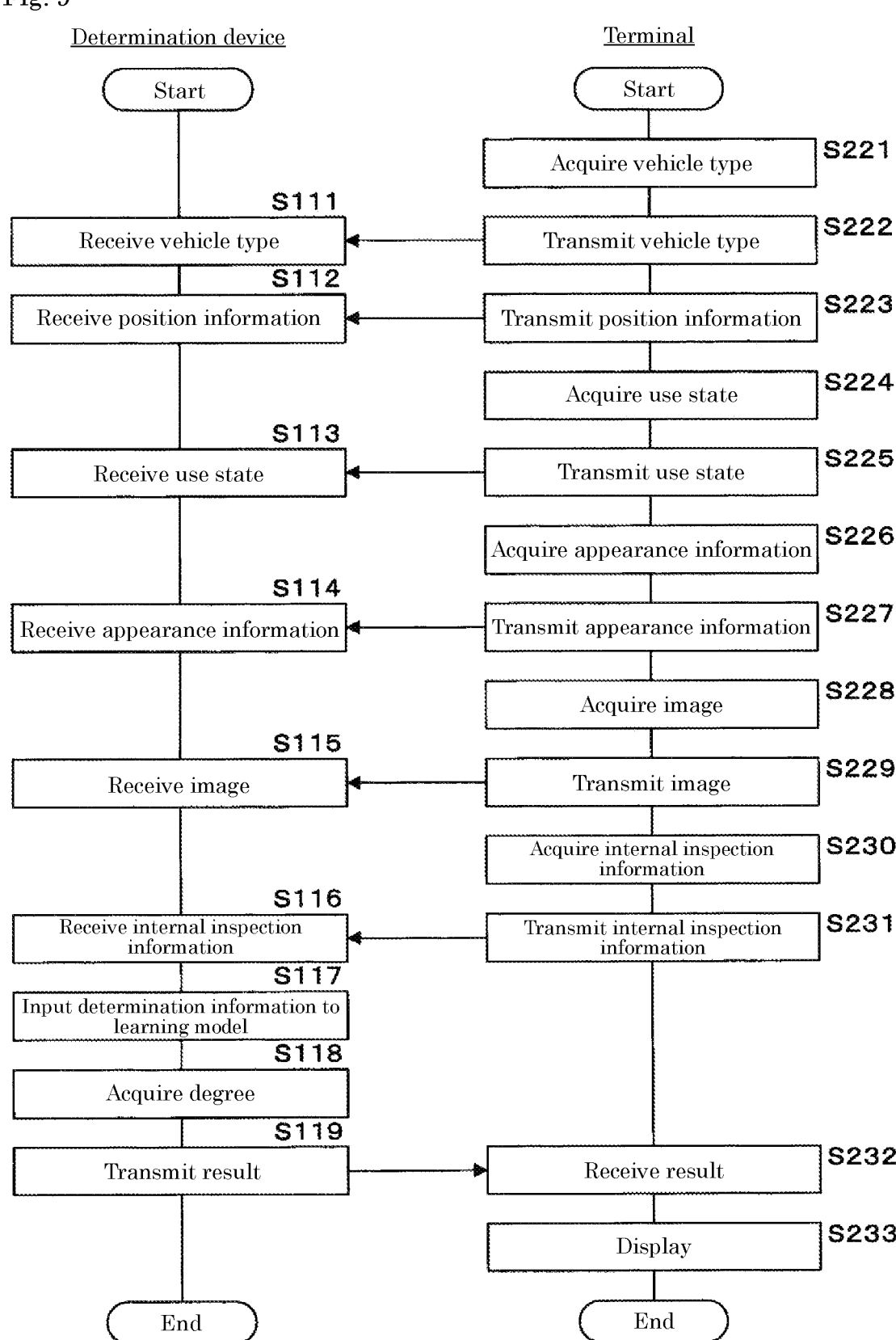
FIG. 9 is a flowchart showing a procedure of processing of determining the degree of guarantee by the control unit.

FIG. 9 is a flowchart showing a procedure of processing of determining the degree of guarantee by the control unit 11.

The control unit 21 acquires the vehicle type input by the staff member using the operation unit 24 (S221).

The control unit 21 transmits the vehicle type to the determination device 1 (S222)

The control unit 11 receives the vehicle type (S111).

The control unit 21 transmits the position information detected by the GPS receiving unit 27 to the determination device 1 (S223).

The control unit 11 receives the position information (S112).

The control unit 21 acquires the use state such as the use period and the travel distance input by the staff member using the operation unit 24 (S224).

The control unit 21 transmits the use state to the determination device 1 (S225).

The control unit 11 receives the use state (S113).

The control unit 21 acquires appearance information such as the liquid smear, the corrosion of a terminal, and the breakage of a container input by the staff member using the operation unit 24 (S226).

The control unit 21 transmits the appearance information to the determination device 1 (S227).

The control unit 11 receives the appearance information (S114).

The control unit 21 acquires an image of the battery 3 captured by the staff member using the camera 4 (S228).

The control unit 21 transmits the image to the determination device 1 (S229).

The control unit 11 receives the image (S115).

The control unit 21 acquires internal inspection information such as the specific gravity of the electrolyte solution measured by the staff member using the hydrometer 6 and the terminal voltage measured by the tester 5 (S230).

The control unit 21 transmits the internal inspection information to the determination device 1 (S231).

The control unit 11 receives the internal inspection information (S116).

The control unit 11 inputs the determination information to the learning model 146 (S117).

The control unit 11 acquires the degree of guarantee based on the probability of the degree of guarantee output from the learning model 146 (S118). For example, the control unit 11 acquires the degree of guarantee when the probability is 80% or more.

The control unit 11 transmits the result of the degree of guarantee to the terminal 2 (S119), and ends the processing.

The control unit 21 receives the determination result (S232).

The control unit 21 displays the determination result on the display panel 25 (S233), and ends the processing.

The control unit 11 can cause the learning model 146 to be relearned so as to improve the reliability of determination based on the degree of guarantee determined using the learning model 146 and the degree of guarantee obtained by actual measurement. For example, in No. 2 in Table 3, since the determination result by the learning model 146 matches the determination result by actual measurement, it is possible to increase the probability of the determination result by inputting a large number of pieces of training data in which the determination result is associated with the determination information in the row of No. 2 and causing relearning. When the determination result by the learning model 146 does not match the determination result by actual measurement, training data in which the determination result by actual measurement is associated is input and relearning is caused.

According to the present embodiment, the degree of deterioration or guarantee of the lead-acid battery can be easily and satisfactorily determined.

The learning model 146 may input the image to a plurality of convolution layers and pooling layers to compress the image, combine the data of the image of the pooling layers with other determination information, and then further input the image to a plurality of convolution layers and pooling layers to compress the image, and output the degree of guarantee.

Although the case where the above-described learning model 146 outputs the degree of guarantee based on the determination information has been described, the present invention is not limited thereto. The deterioration degree may be output based on the determination information. The control unit 11 acquires the deterioration degree from the learning model 146, and determines the degree of guarantee based on the deterioration degree.

Third Embodiment

Figure 10:
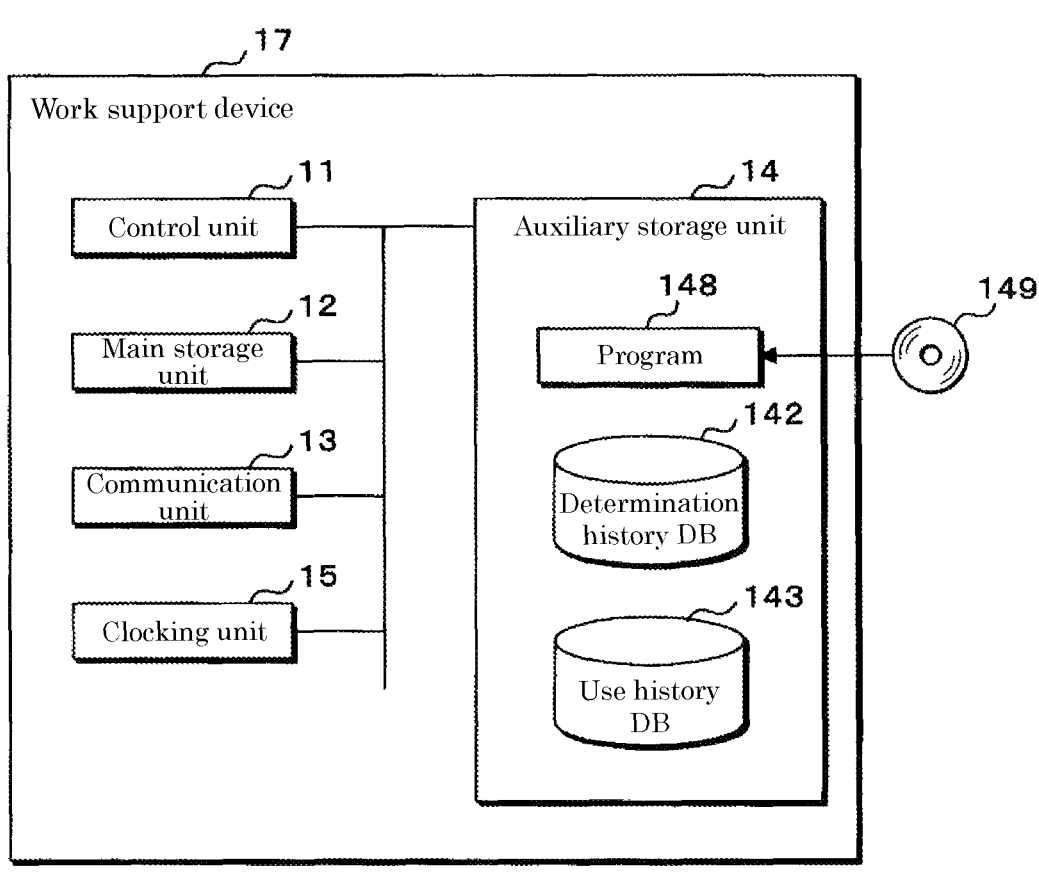
FIG. 10 is a block diagram showing an example of a configuration of a work support device according to a third embodiment.

FIG. 10 is a block diagram showing an example of a configuration of a work support device 17 according to a third embodiment. The work support device 17 according to the third embodiment has the same configuration as the determination device 1 according to the first embodiment except that a program 148 is stored in the auxiliary storage unit 14 and the program 148 is installed in the auxiliary storage unit 14 by a recording medium 149. The terminal 2 of a store of the battery 3 is connected to the work support device 17 via the network N such as the Internet.

Figure 11:
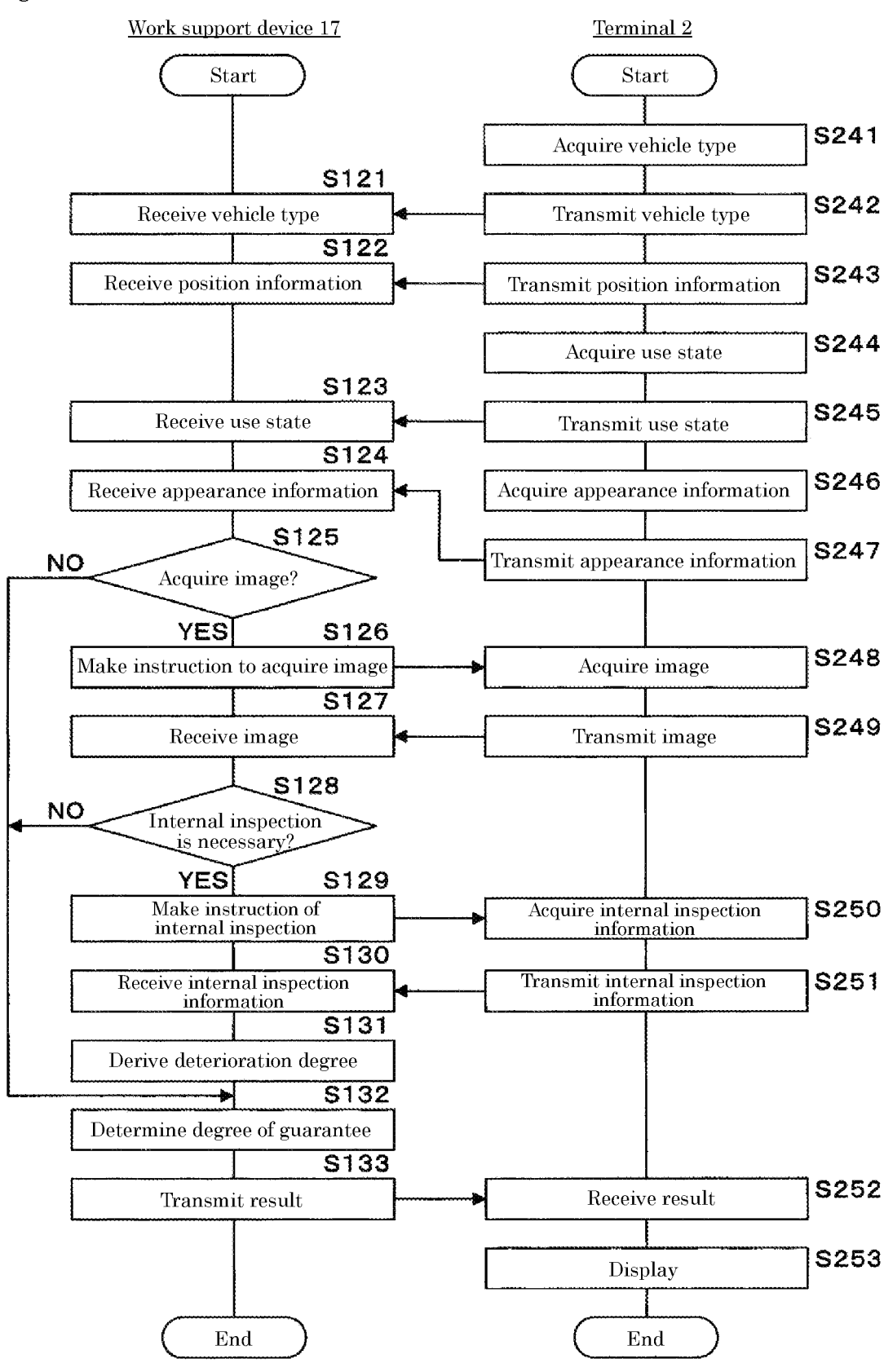
FIG. 11 is a flowchart showing a procedure of processing of determination by the control unit.

FIG. 11 is a flowchart showing a procedure of processing of determination by the control unit 11.

The control unit 21 acquires the vehicle type input by the staff member using the operation unit 24 (S241).

The control unit 21 transmits the vehicle type to the work support device 17 (S242).

The control unit 11 receives the vehicle type (S121).

The control unit 21 transmits the position information detected by the GPS receiving unit 27 to the work support device 17 (S243).

The control unit 11 receives the position information (S122).

The control unit 21 acquires the use state such as the use period and the travel distance input by the staff member using the operation unit 24 (S244).

The control unit 21 transmits the use state to the work support device 17 (S245).

The control unit 11 receives the use state (S123).

The control unit 21 acquires appearance information such as the liquid smear, the corrosion of a terminal, and the breakage of a container input by the staff member using the operation unit 24 (S246).

The control unit 21 transmits the appearance information to the work support device 17 (S247).

The control unit 11 receives the appearance information (S124).

The control unit 11 determines whether or not it is necessary to acquire an image of the next work (S125). The control unit 11 reads the determination history DB 142 and derives the deterioration degree based on the rule base of the relationship between the vehicle type, the position information, the use state, and the appearance information and the deterioration degree. The control unit 11 may derive the deterioration degree based on a value of a function based on the relationship and a threshold value. When determining that the deterioration degree is 1 and it is not necessary to acquire an image (S125: NO), the control unit 11 advances the processing to S132 and determines that the degree of guarantee is 1.

When it is necessary to acquire an image (S125: YES), the control unit 11 transmits an instruction to acquire an image to the terminal 2 (S126).

The control unit 21 receives the instruction, displays the instruction on the display panel 25, or outputs a voice from the speaker to prompt the staff member to acquire an image, and acquires an image of the battery 3 captured by the staff member using the camera 4 (S248).

The control unit 21 transmits the image to the work support device 17 (S249).

The control unit 11 receives the image (S127).

The control unit 11 determines whether or not an internal inspection of the next work is necessary (S128). The control unit 11 reads the determination history DB 142 and derives the deterioration degree based on the rule base of the relationship between the vehicle type, the position information, the use state, the appearance information, and the image and the deterioration degree. The control unit 11 may derive the deterioration degree based on a value of a function based on the relationship and a threshold value. When determining that the deterioration degree is 2 and the internal inspection is not necessary (S128: NO), the control unit 11 advances the processing to S132 and determines that the degree of guarantee is 2.

When the internal inspection is necessary (S128: YES), the control unit 11 transmits an instruction of the internal inspection to the terminal 2 (S129).

The control unit 21 displays the instruction on the display panel 25 or outputs a voice from the speaker to prompt the staff member to perform the internal inspection, and acquires the internal inspection information (S250).

The control unit 21 transmits the internal inspection information to the work support device 17 (S251).

The control unit 11 receives the internal inspection information (S130).

The control unit 11 derives the deterioration degree based on the rule base of the relationship between the vehicle type, the position information, the use state, the appearance information, the image, and the internal inspection information and the deterioration degree (S131). The control unit 11 may derive the deterioration degree based on a value of a function based on the relationship and a threshold value.

The control unit 11 determines the degree of guarantee based on the deterioration degree (S132).

The control unit 11 transmits the determination result to the terminal 2 (S133), and ends the processing.

The control unit 21 receives the determination result (S252).

The control unit 21 displays the determination result on the display panel 25 (S253), and ends the processing.

According to the present embodiment, since the work support device 17 determines whether or not to perform the next determination work based on the result of one determination process, it is possible to omit an unnecessary determination process and to efficiently determine the degree of deterioration or guarantee of the lead-acid battery. Note that the contents of the determination process are not limited to the above-described case.

The present invention is not limited to the contents of the above-described embodiments, and various modifications can be made within the scope indicated in the claims That is, embodiments obtained by combining technical means appropriately changed within the scope indicated in the claims are also included in the technical scope of the present invention.

DESCRIPTION OF REFERENCE SIGNS

1: determination device
2: terminal
3: battery
4: camera (imaging unit)
5: tester (voltage measurement unit)
6: hydrometer (specific gravity measurement unit)
10: deterioration determination system
11: control unit
12: main storage unit
13, 23: communication unit
14, 26: auxiliary storage unit
141, 145, 148: program
144, 147, 149, 262: recording medium
261: web browser program
142: determination history DB
143: use history DB
146: learning model
21: control unit
24: operation unit
25: display panel
27: GPS receiving unit
28: speaker

The invention claimed is:

1. A determination device comprising:
a processor and a storage,
wherein the processor is configured to:
acquire training data in which determination information is associated with a degree of deterioration or a degree of guarantee of a lead-acid battery, the determination information including at least one of appearance information or image information of the lead-acid battery;
train a multilayer neural network by:
inputting, in an input layer of the multilayer neural network, the determination information in the training data;
outputting, from an output layer of the multilayer neural network, a determination result of a degree of deterioration or a degree of guarantee;
comparing the determination result output from the output layer with a correct value which is information labeled with the determination information in the training data; and
optimizing a parameter used for a calculation processing in an intermediate layer of the multilayer neural network so that an output value from the output layer approaches the correct value using an error back propagation method, the parameter being at least one of a coupling coefficient or a coefficient of an activation function;
store the trained multilayer neural network in the storage;
receive the determination information from a terminal connected to the determination device via a network;
input the received determination information to the trained multilayer neural network;
acquire the degree of deterioration or the degree of guarantee of the lead-acid battery from the trained multilayer neural network; and retrain the trained multilayer neural network by:

comparing the degree of deterioration or the degree of guarantee determined using the trained multilayer neural network and the degree of deterioration or the degree of guarantee obtained by actual measurement;

if the degree of deterioration or the degree of guarantee determined using the trained multilayer neural network matches the degree of deterioration or the degree of guarantee obtained by actual measurement, inputting pieces of training data in which the determination result is associated with the degree of deterioration or the degree of guarantee determined using the trained multilayer neural network in the trained multilayer neural network; and if the degree of deterioration or the degree of guarantee determined using the trained multilayer neural network does not match the degree of deterioration or the degree of guarantee obtained by actual measurement, inputting training data in which the determination result is associated with the degree of deterioration or the degree of guarantee obtained by actual measurement in the trained multilayer neural network, wherein the degree of deterioration includes information indicating that a deterioration is caused by a user's fault, the degree of guarantee includes:

a first degree indicating that the lead-acid battery is returned to a user as a normal product;

a second degree indicating that although the lead-acid battery is normal, the lead-acid battery is returned after performing auxiliary charge;

a third degree indicating that the lead-acid battery is exchanged as an abnormal product; and a fourth degree indicating that although the lead-acid battery is an abnormal product, an abnormality has occurred due to an action of the user, and replacement is performed for a fee, and the multilayer neural network is configured to input the image information to a plurality of convolution layers and pooling layers to compress the image information, combine data of the image information of the pooling layers with other determination information, and then further input the image information to the plurality of convolution layers and pooling layers to compress the combined data of the image information and other determination information, and output the degree of deterioration or the degree of guarantee.

2. A deterioration determination method by a determination device comprising a storage and a processor, the deterioration determination method comprising:

acquiring, by the processor, training data in which determination information is associated with a degree of deterioration or a degree of guarantee of a lead-acid battery, the determination information including at least one of appearance information or image information of the lead-acid battery;

training, by the processor, a multilayer neural network by:

inputting, in an input layer of the multilayer neural network, the determination information in the training data;

outputting, from an output layer of the multilayer neural network, a determination result of a degree of deterioration or a degree of guarantee;

comparing the determination result output from the output layer with a correct value which is information labeled with the determination information in the training data; and optimizing a parameter used for a calculation processing in an intermediate layer of the multilayer neural network so that an output value from the output layer approaches the correct value using an error back propagation method, the parameter being at least one of a coupling coefficient or a coefficient of an activation function;

storing, by the processor, the trained multilayer neural network in the storage;

receiving, by the processor, the determination information from a terminal connected to the determination device via a network;

inputting, by the processor, the received determination information to the trained multilayer neural network;

acquiring, by the processor, the degree of deterioration or the degree of guarantee of the lead-acid battery from the trained multilayer neural network; and retraining the trained multilayer neural network by:

comparing the degree of deterioration or the degree of guarantee determined using the trained multilayer neural network and the degree of deterioration or the degree of guarantee obtained by actual measurement;

if the degree of deterioration or the degree of guarantee determined using the trained multilayer neural network matches the degree of deterioration or the degree of guarantee obtained by actual measurement, inputting pieces of training data in which the determination result is associated with the degree of deterioration or the degree of guarantee determined using the trained multilayer neural network in the trained multilayer neural network; and if the degree of deterioration or the degree of guarantee determined using the trained multilayer neural network does not match the degree of deterioration or the degree of guarantee obtained by actual measurement, inputting training data in which the determination result is associated with the degree of deterioration or the degree of guarantee obtained by actual measurement in the trained multilayer neural network wherein the degree of deterioration includes information indicating that a deterioration is caused by a user's fault, the degree of guarantee includes:

a first degree indicating that the lead-acid battery is returned to a user as a normal product;

a second degree indicating that although the lead-acid battery is normal, the lead-acid battery is returned after performing auxiliary charge;

a third degree indicating that the lead-acid battery is exchanged as an abnormal product; and a fourth degree indicating that although the lead-acid battery is an abnormal product, an abnormality has occurred due to an action of the user, and replacement is performed for a fee, and the multilayer neural network is configured to input the image information to a plurality of convolution layers and pooling layers to compress the image information, combine data of the image information of the pooling layers with other determination information, and then further input the image information to the plurality of convolution layers and pooling layers to compress the combined data of the image information and other determination information, and output the degree of deterioration or the degree of guarantee.

* * * * *